United States Patent
Anumula et al.

[19]

[11] Patent Number: 6,041,388
[45] Date of Patent: Mar. 21, 2000

[54] CIRCUIT AND METHOD FOR CONTROLLING MEMORY DEPTH

[75] Inventors: Sudhaker Reddy Anumula, Starkville, Miss.; Ping Wu, Austin, Tex.

[73] Assignee: Cypress Semiconductor Corporation, San Jose, Calif.

[21] Appl. No.: 08/804,025

[22] Filed: Feb. 19, 1997

Related U.S. Application Data

[60] Provisional application No. 60/032,816, Dec. 11, 1996.

[51] Int. Cl.$^7$ ........................................ G06F 13/00
[52] U.S. Cl. ..................................... 711/100; 365/189.01
[58] Field of Search ..................................... 395/281–291, 395/894, 886, 307, 306; 365/238.05, 219, 238, 220, 189.01; 711/100; 326/38, 40

[56] References Cited

U.S. PATENT DOCUMENTS

| | | | |
|---|---|---|---|
| 4,371,928 | 2/1983 | Barlow et al. | 364/200 |
| 5,083,296 | 1/1992 | Hara et al. | 365/230.02 |
| 5,504,875 | 4/1996 | Mills et al. | 395/497.02 |
| 5,572,148 | 11/1996 | Lytle et al. | 326/41 |
| 5,715,205 | 2/1998 | Sywyk | 365/219 |
| 5,717,901 | 2/1998 | Sung et al. | 326/38 |
| 5,804,986 | 9/1998 | Jones | 326/40 |
| 5,812,472 | 9/1998 | Lawrence et al. | 365/201 |
| 5,835,502 | 11/1998 | Aipperspach et al. | 714/718 |
| 5,844,854 | 12/1998 | Lee | 365/230.01 |

*Primary Examiner*—John W. Cabeca
*Assistant Examiner*—Pierre-Michel Bataille
*Attorney, Agent, or Firm*—Blakely, Sokoloff, Taylor & Zafman LLP

[57] ABSTRACT

A memory array having a physical depth of 2N-bits (N being an integer) includes control and data bus logic configured to control read and/or write operation in the memory array and to select the depth of the memory array. The control logic may include upper and lower byte control circuitry and the depth of the array may be selected from a group consisting of xN-bits and 2xN-bits, x being an integer. The control and data bus logic may be implemented as metal options within the device to be selected during fabrication to achieve a desired array depth.

19 Claims, 8 Drawing Sheets

| IOL0 | | IOL17 |
|---|---|---|
| | . . . | |
| 3 2 1 0 | | 3 2 1 0 |

← Columns

Red. R.0
Red. R.1
Row 0
Row 1

.

.

.

MCORE

Row 254
Row 255
Red. R.2
Red. R 3

| 3 2 1 0 | | 3 2 1 0 |
|---|---|---|
| | . . . | |
| IOR0 | | IOR17 |

← Columns

Fig. 4

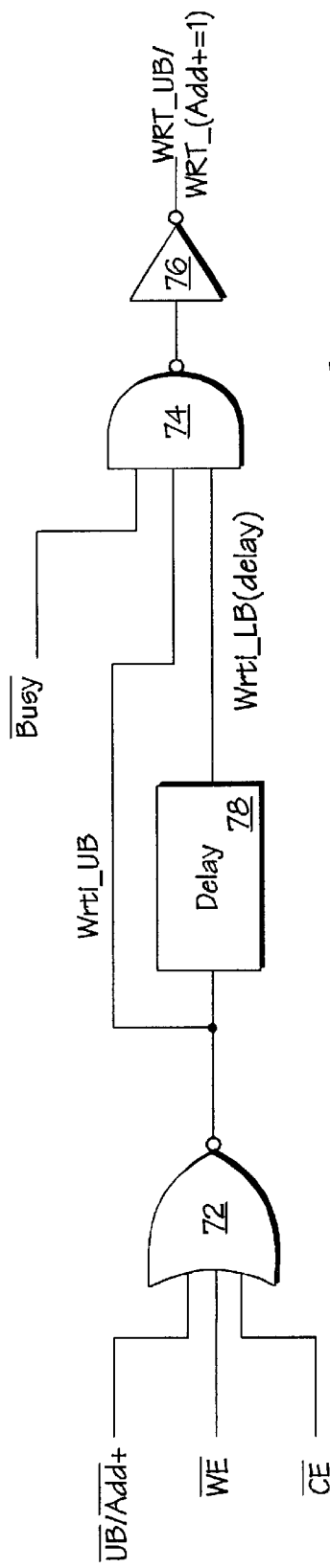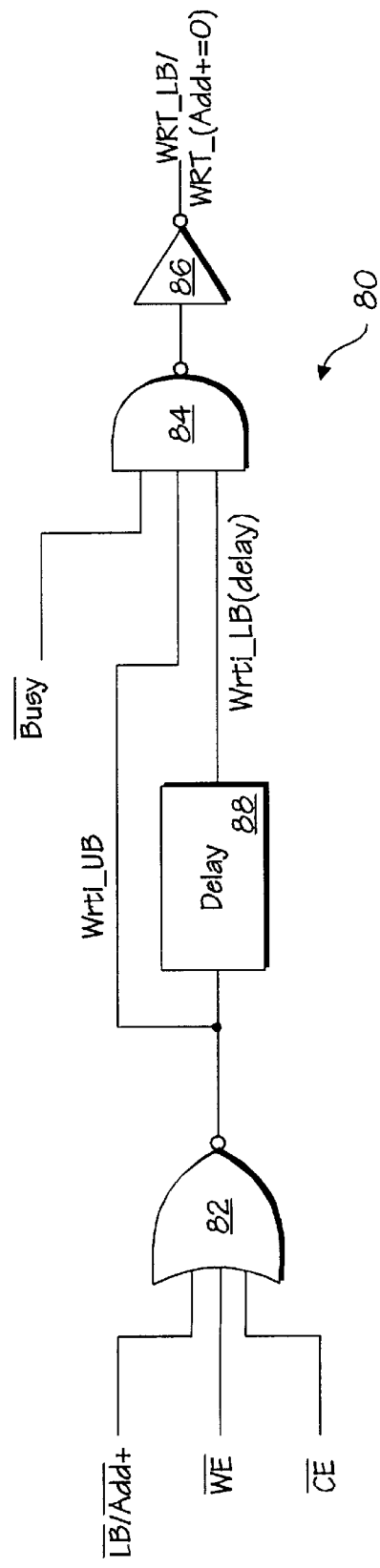

CIRCUIT AND METHOD FOR CONTROLLING MEMORY DEPTH

RELATED APPLICATIONS

The present application is related to and hereby claims the benefit of the filing date of a Provisional Application for Patent entitled "Novel Circuit and Method for Controlling Memory Depth", filed Dec. 11, 1996, and assigned application Ser. No. 60/032,816.

FIELD OF THE INVENTION

The present invention is directed to memory decoding circuitry and, in particular, decoding circuitry for use in a memory configuration according to a data bus width.

BACKGROUND

FIG. 1 illustrates a typical random access memory architecture. The memory 10 includes a matrix or array 12 of storage cells 14 having a capacity defined by the number of rows and columns in the array. The array 12 illustrated in FIG. 1 has a capacity of $2^N \times 2^M$ where N indicates the number address lines devoted to row selection and M indicates the number of address lines devoted to column selection.

To read data from or write data to the array 12, a row address is input to and decoded in row decoder 16 to select a row or word line 18. This activates all of the memory cells 14 in the selected row. Simultaneously, a column address is input to and decoded in column decoder 20 to select a column or bit line 22. The memory cell 14 located at the intersection of the selected word and bit lines is then accessed.

The memory 10 also includes an input/output (I/O) control circuit 24 which is used to control the flow of data into or out of the memory array 12. A data bus 26 having Q+1 total data lines is coupled to the I/O control circuit 24 and may be used to write to or read from the array 12. Control signals including a chip enable ($\overline{CE}$) signal, an output enable ($\overline{OE}$) signal and a write enable ($\overline{WE}$) signal are provided to the I/O control circuit 24 to control the direction of data flow between the data bus 26 and the array 12. A write operation may be controlled by the $\overline{CE}$ and $\overline{WE}$ signals. When reading the device, both the $\overline{OE}$ and $\overline{CE}$ signals may need to be asserted while $\overline{WE}$ is deasserted.

The "depth" of a memory array such as array 12 refers to the width of the data bus ($D_0$–$D_Q$) which the array is capable of interfacing with. For example, a memory array which is 16-bits deep refers to an array which is organized so as to interface with a 16-bit data bus (i.e., a data bus where Q=15). In such an architecture, the memory array is organized so as to allow access to 16 memory cells at a time. In contrast, an 8-bit deep array is organized so as to allow access to only 8 memory cells at a time. Despite this depth difference, however, the physical size of the memory arrays in the 16-bit deep memory and the 8-bit deep memory may be the same. For example, a memory device having an array of 128K memory cells may be organized as a 16K×8 (16K words of 8-bits each) device or an 8K×16 (8K words of 16-bits each) device.

Because various applications require memory devices having different depths, memory device manufacturers are required to provide various memory devices which may have memory arrays of similar physical size but which are organized differently. To reduce design and fabrication costs, such manufacturers often design these memory devices so that the same chip layout may be used. That is, a common layout is used for memory devices to be organized as N-bit deep devices as is used for memory devices to be organized as 2N-bit deep devices. Additional decoding circuitry is provided on the chip (e.g., at the periphery of the array) to allow control of the memory depth according to whether a 2N-bit deep architecture or an N-bit architecture is desired.

FIG. 2 shows a typical scheme for controlling memory depth. Assume that a memory device has an array organized into a number of groups of columns. Each column contains a number of rows of memory cells. In general, the address decoding circuitry will be arranged so that high order address bits are used to select a particular group and column while low order address bits are used to select a particular row. For example, in the case of a 128K memory array arranged as 8 groups of 4 columns of memory cells, each column having 256 rows, address bits $A_{10}$–$A_{12}$ may be used to select one of the 8 groups, bits $A_8$ and $A_9$ may be used to select one of the four columns within the selected group and bits $A_0$–$A_7$ may be used to select one of the 256 rows of the selected column.

It will be appreciated that the above example would be suitable for a 128K memory device organized as 8K×16. A total of 8K (=$2_{13}$) words, each 16-bits long, are addressable using the above decoding scheme. If the same decoding logic were to be used for a 16K×8 implementation, however, an additional level of decoding would be required. For example, as shown in FIG. 2, each group select signal (Grp [0]–Grp [7]) from a group decode circuit could be applied to decoder logic 40 along with an additional address bit (Add+) to uniquely decode a sub-group within each group. Each subgroup would be 8-bits wide, thus permitting access to 16K words total.

Additional decoding schemes such as that illustrated in FIG. 2 are commonly employed by memory manufacturers wishing to use common layouts for N-bit and 2N-bit memory architectures. Some of the memory devices so manufactured will be utilized as N-bit architectures and will thus employ the extra level of decoding while other memory devices will be utilized as 2N-bit architectures and will not employ the extra decoding logic. For the N-bit devices then, the extra decoding logic represents additional chip area and cost and could also cause a penalty in access time. Nevertheless, such schemes are common because of the desire to fabricate memory devices using common layout schemes.

In view of the above, it would be desirable to implement a circuit for controlling memory depth in a memory device which eliminated the need for the extra decoding circuitry described above.

SUMMARY OF THE INVENTION

A memory array having a physical depth of 2N-bits (N being an integer) includes control logic configured to control read and/or write operation in the memory array and to select the depth of the memory array. The control logic may include upper and lower byte control circuitry and the depth of the array may be selected from a group consisting of xN-bits and 2xN-bits, x being an integer. The control logic may be a metal option within the device to be selected during fabrication.

BRIEF DESCRIPTION OF THE DRAWINGS

The present invention is illustrated by way of example and not limitation in the figures of the accompanying drawings in which:

FIG. 4 is a block diagram of an exemplary memory core group of the layout of FIG. 3;

FIG. 5a illustrates an exemplary write control circuit for selecting the depth of a memory as either a 2N-bit-deep architecture or an N-bit-deep architecture in accordance with the present invention;

FIG. 5b illustrates further exemplary write control circuitry for selecting the depth of a memory as either a 2N-bit-deep architecture or an N-bit-deep architecture in accordance with the present invention;

DETAILED DESCRIPTION

Figure 1:
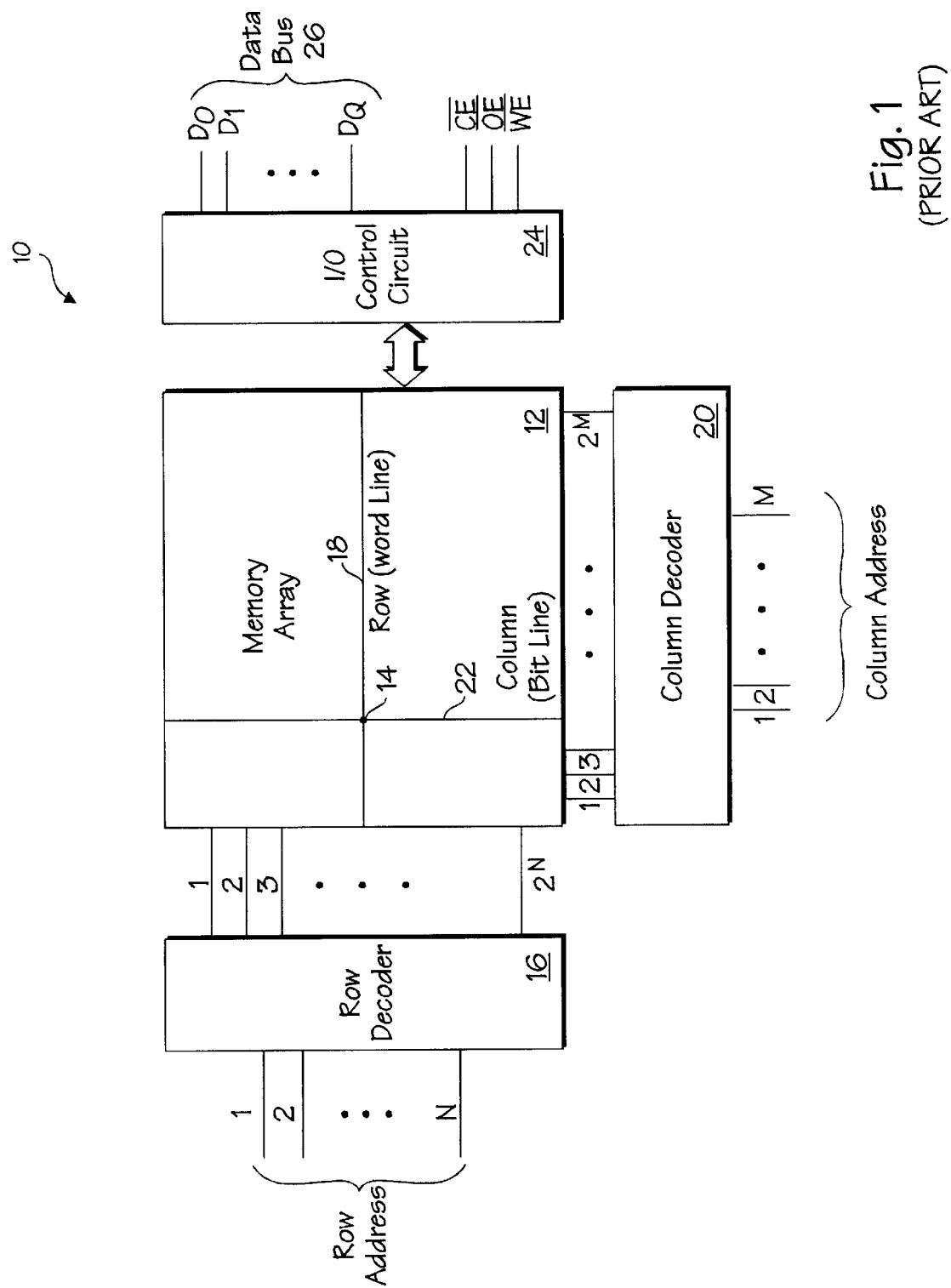
FIG. 1 illustrates a typical memory architecture.
Figure 2:
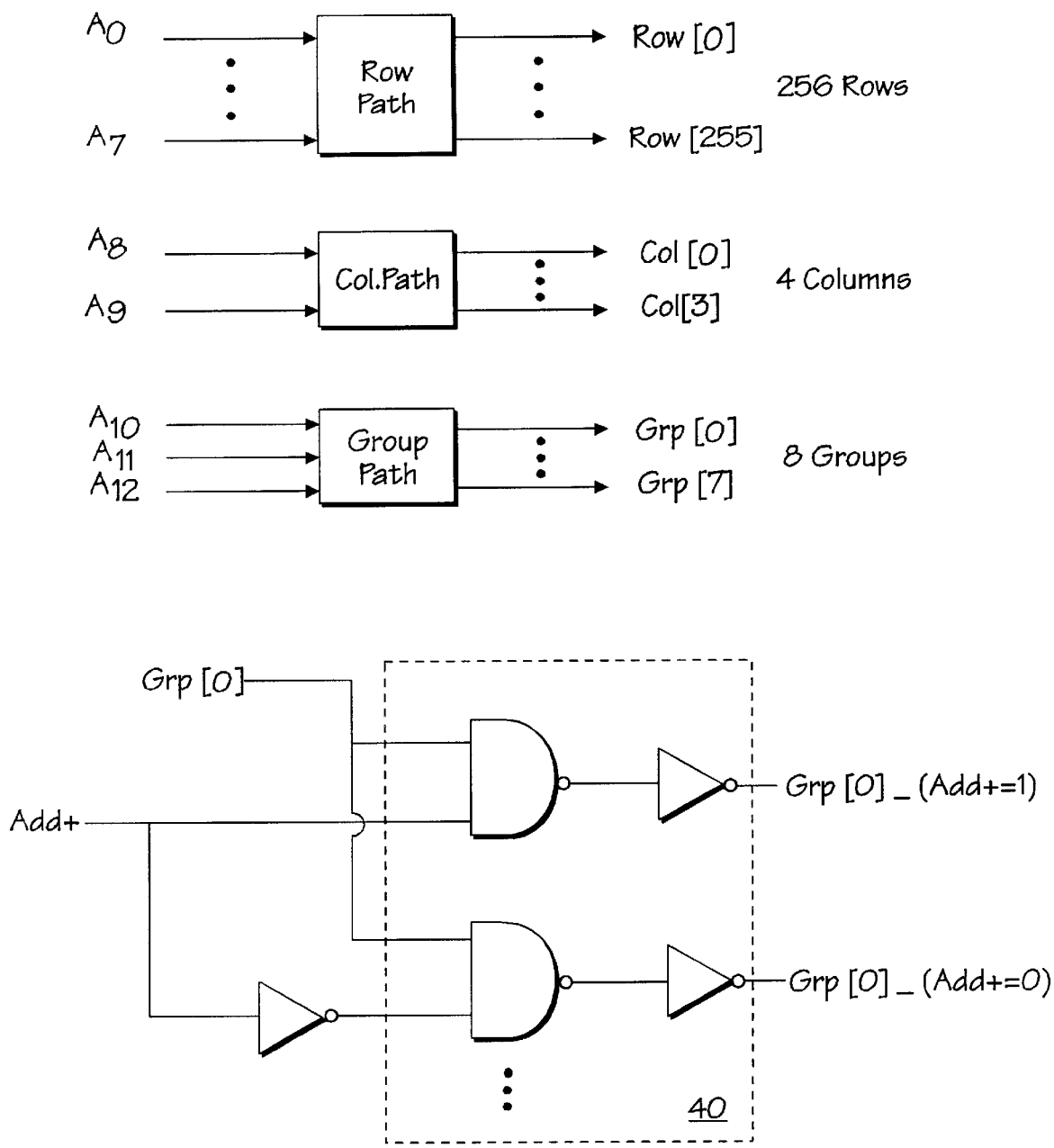
FIG. 2 illustrates a typical decoding scheme which may be employed in a memory architecture such as that illustrated in FIG. 1.

A novel method and circuit for controlling memory depth (e.g., the number of bits carried by a data bus for given data word) in an integrated circuit, semiconductor memory device and/or single-chip semiconductor device are described. The present invention enables one to realize or effect an N-bit deep memory architecture from a (physically implemented) 2N-bit deep memory architecture, where N is an integer, preferably $\geq 2^m$ (where $m \geq 1$, 2, or 3), and more preferably 8 or 9. In the present invention, the change in memory depth is effected using an "extra" address bit. Whereas, the 2N-bit deep memory architecture may use m address bits for decoding, the N-bit deep memory architecture uses (m+1) address bits for decoding. The present invention may permit the user to minimize overhead associated with extra and/or unnecessary address decoding circuitry, and may minimize access time ($t_{AA}$) penalties, thus providing superior address set-up ($t_{SA}$) and address hold ($t_{HA}$) times on the extra address bit.

The memory device may be a random access memory (RAM; e.g., a dynamic RAM, a static RAM, a pseudostatic RAM, etc.), a first-in-first-out (FIFO) memory, a content addressable memory (CAM), etc., or any combination thereof, and may have one or two ports per memory cell (preferably two ports). In one embodiment, the memory comprises a dual-port static RAM (such as one commercially available from Cypress Semiconductor Corporation, San Jose, Calif., under device nos. CY7C006, CY7C016, CY7C025, and CY7C0251), the basic architecture of which is described in greater detail below. Note that in the following description, reference is made to various array archetectures and metal options. It should be recognized that device no. CY7C006 has a 16K×8 architecture and is the metal option counterpart of device nos CY7C025, which has an 8K×16 architecture. Similarly, device no. CY7C016 has a 16K×9 architecture and is the metal option counterpart of device no. CY7C0251, which has an 8K ×18 architecture.

In the present invention, the extra address bit (designated as "Add+" in the Figures discussed below) may be combined with read and/or write control logic (preferably write control logic) to generate read and/or write control signals for logic selecting an N-bit-deep memory architecture. The address bit(s) may use existing upper-byte and lower-byte control signal connections (e.g., byte control lines) as means for selecting the N-bit-deep memory architecture (and, in a further embodiment, for controlling read and/or write operations) without consuming additional chip real estate area.

The present N-bit deep scheme is unique in the use of one or more existing read and/or write control with arbitration delay circuits (preferably write control with arbitration delay circuits) to improve $t_{SA}$ and $t_{HA}$ margins for the address bit(s), while enabling one to bypass the read and/or write delay circuits for $t_{AA}$ associated with the extra address bit. In the dual-port memory embodiment of the present invention, arbitration delay margin and $t_{SA}$ margin is typically used in the write control delay. In the single port memory embodiment of the present invention, write control logic with $t_{SA}$ delay margin is typically used. The selection of memory depth according to the present invention may be implemented using a metal option, in accordance with techniques known to those of ordinary skill in the relevant arts. Additional metal options and/or extra address bits may permit one to select the depth of the memory from N bits, 2N bits, xN bits and/or (2x)N bits (where x is an integer).

Figure 3:
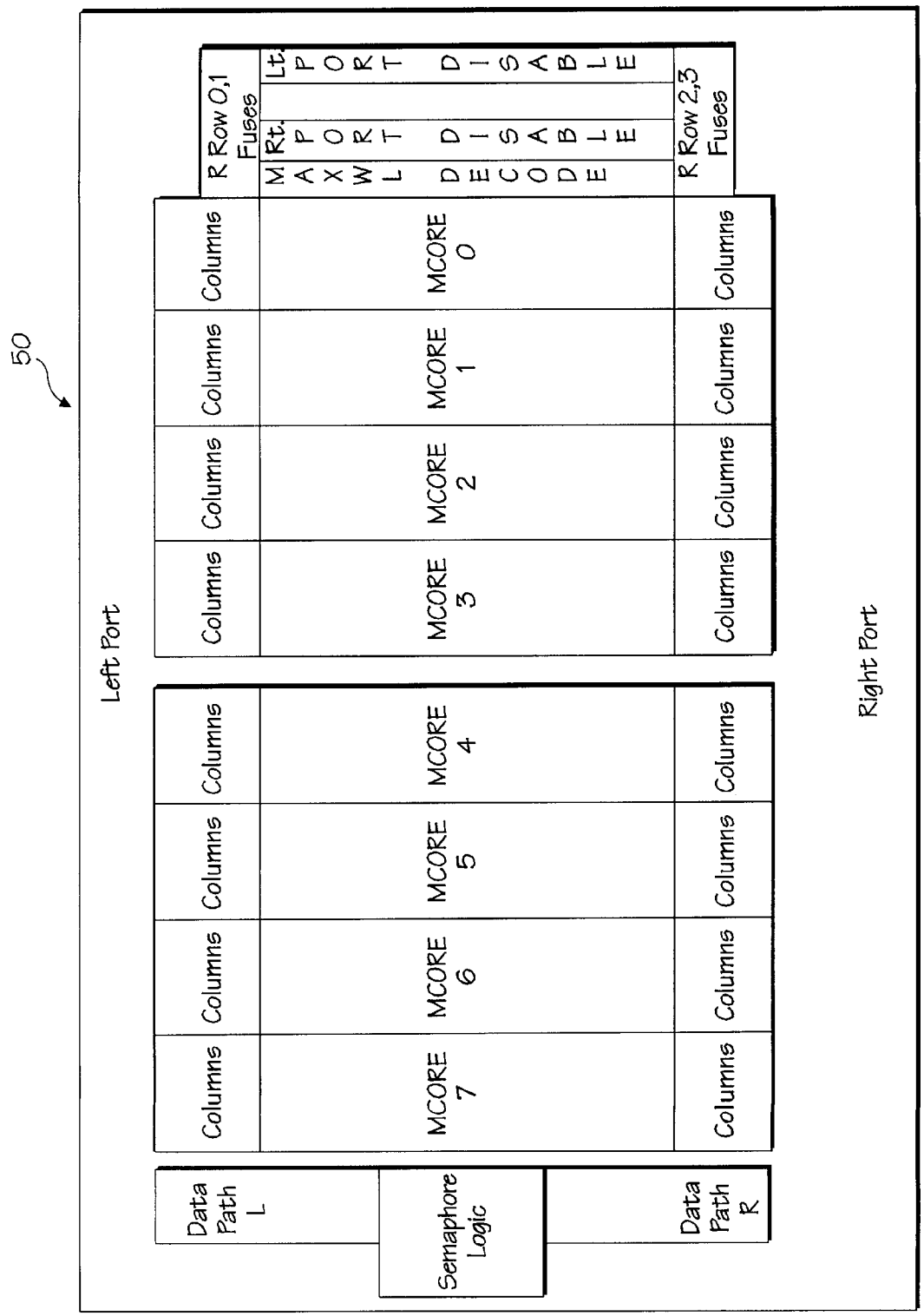
FIG. 3 is a block diagram of an embodiment of a memory array layout according to the present invention.

FIG. 3 is a block diagram of an embodiment of a memory array layout 50 according to the present invention, where "MAXWL DECODE" refers to a memory cell word line driver that may be located in a row and/or a group address decoder, and "MCORE" refers to a memory core group of the array. As illustrated, two ports are provided permitting independent, asynchronous access for reads and writes to any location in memory. The memory device can be utilized as standalone 16/18-bit dual-port static RAM or multiple devices can be combined in order to function as a 32/36-bit or wider master/slave dual-port static RAM. Application areas include interprocessor/multiprocessor designs, communications status buffering and dual-port video/graphics memory.

Each port has independent control signals: chip enable ($\overline{CE}$), read or write enable ($R/\overline{W}$), and output enable ($\overline{OE}$). Two flags are provided on each port ($\overline{BUSY}$ and $\overline{INT}$). $\overline{BUSY}$ signals that the port is trying to access the same location currently being accessed by the other port. The interrupt flag ($\overline{INT}$) permits communication between ports or systems by means of a mail box. Semaphores are used to pass a flag, or token, from one port to the other to indicate that a shared resource is in use. The semaphore logic is comprised of eight shared latches. Only one side can control the latch (semaphore) at any time. Control of a semaphore indicates that a shared resource is in use. An automatic power-down feature is controlled independently on each port by a chip select ($\overline{CE}$) signal. The memory device may be configured as an array of 8K words of 16/18 bits each and 16K words of 8/9 bits each.

During write operations, data must be set up for a duration of $t_{SD}$ before the rising edge of $R/\overline{W}$ in order to guarantee a valid write. A write operation is controlled by either the $R/\overline{W}$ signals or the $\overline{CE}$ signal. If a location is being written to by one port and the opposite port attempts to read that location, a port-to-port flow through delay must occur before the data is read on the output; otherwise the data read is not deterministic. Data will be valid on the port $t_{DDD}$ after the data is presented on the other port. When reading the device, both the $\overline{OE}$ and $\overline{CE}$ signals are asserted and $\overline{WE}$ is deasserted. Data will be available $t_{ACE}$ after $\overline{CE}$ or $t_{DDE}$ after $\overline{OE}$ is asserted.

The upper two memory locations may be used for message passing. The highest memory location may be used as a mailbox for the right port and the second-highest memory location as a mailbox for the left port. When one port writes to the other port's mailbox, an interrupt is generated to the owner port. The interrupt is reset when the owner port reads the contents of the mailbox. The message may be user defined.

Each port can read the other port's mailbox without resetting the interrupt. The active state of the busy signal (to a port) prevents the port from setting the interrupt to the winning port. Also, an active busy to a port prevents that port from reading its own mailbox and thus reading the interrupt to it.

As indicated, on-chip arbitration is provided to resolve simultaneous memory location access (contention). If both ports' $\overline{CE}$ are asserted and an address match occurs within $t_{PS}$ of each other, "busy logic" will determine which port receives access. If tps is violated, one port will be permitted to access the location, but which port is not predictable. $\overline{BUSY}$ will be asserted $t_{BLA}$ after an address match or $t_{BLC}$ after $\overline{CE}$ is taken LOW.

In addition, eight semaphore latches, which are separate from the dual-port memory locations, are provided. Semaphores are used to reserve resources that are shared between the two ports. The state of the semaphore indicates whether a resource is in use. For example, if the left port wants to request a given resource, it sets a latch by writing a zero to a semaphore location. The left port then verifies its success in setting the latch by reading it. After writing to the semaphore, a semaphore control signal or $\overline{OE}$ must be reasserted for $t_{SOP}$ before attempting to read the semaphore. The semaphore value will be available $t_{SWRD}+t_{DOE}$ after the rising edge of a semaphore write. If the left port was successful (reads a zero), it assumes the right port has control and continues to poll the semaphore. When the right side has relinquished control of the semaphore (by writing a one), the left side no longer requires the semaphore, a one is written to cancel its request.

FIG. 4 is a block diagram of an exemplary memory core group 60 of the layout of FIG. 3, where "IO" refers to an input/output circuit (for 2N-bit deep architectures) and to either an input or output circuit (for N-bit deep architectures) (L and R refer to the left and right ports respectively), and "RedR" refers to redundant row.

FIGS. 5a and 5b show exemplary (logic) circuits for selecting the depth of memory array 50, where $\overline{UB}$ refers to the complement of an upper byte control signal, $\overline{WE}$ refers to the complement to a write enable signal, $\overline{CE}$ refers to the complement of a chip enable signal, $\overline{LB}$ refers to the complement of a lower byte control signal, and $\overline{BUSY}$ refers to the complement of a busy signal generated as described above.

The upper and lower byte control signals, $\overline{UB}$ and $\overline{LB}$, are used to select the upper or lower byte of an MCORE group, respectively. It will be appreciated that the $\overline{UB}$ and $\overline{LB}$ signals are used when the memory array 50 is to be used as a 2N-bit deep array, e.g., in an 8K×16 memory device. The signals WRT_UB and WRT_LB produced by logic circuits 70 and 80 will be used as write control signals which, when activated, allow data to be written to cells within memory array 50.

Referring to FIG. 5a, logic circuit 70 represents write path circuitry for write control signal WRT_UB. Logic circuit 70 includes NOR gate 72, NAND gate 74 and inverter 76. In addition, a delay element 78 which represents a write control delay associated with required address setup times is also present. For example, the delay may include a timing margin for evaluation of a BUSY condition which may be present during a write contention cycle. In operation, upper byte control signal $\overline{UB}$, is applied to NOR gate 72 along with write enable signal $\overline{WE}$ and chip enable signal $\overline{CE}$. Chip enable signal $\overline{CE}$ may be generated off-chip, for example by a processor seeking to write data to the memory device containing memory array 50. Write enable signal $\overline{WE}$ may be generated on-chip as a logical combination of a $R/\overline{W}$ signal and the $\overline{CE}$ signal from a processor. Alternatively, $\overline{WE}$ may be generated off-chip by the same processor that generates the $\overline{CE}$ signal.

In general, $\overline{WE}$, $\overline{CE}$ and $\overline{UB}$ will be logic LOWs for a write operation to the upper byte. When these signals all transition to a logic LOW, signal Wrti_UB will transition to a logic HIGH, after a delay time associated with NOR gate 72. Similarly, signal Wrti_UB (delay) will transition to a logic HIGH after a write control delay associated with delay element 78. The write control delay is required to guard against contention and meet tSA setup times during a write cycle as discussed above.

The $\overline{BUSY}$ signal will not be asserted (active LOW) unless the memory location for which access is sought is already being accessed by the other port. Thus, $\overline{BUSY}$ will typically be a logic HIGH. When Wrti_UB and Wrti_UB (delay) both have attained logic HIGH levels, NAND gate 74 and inverter 76 operate to produce write control signal WRT_UB, which transitions from a logic LOW to a logic HIGH (active). The active write control signal thus allows access to the addressed memory locations.

As indicated, the above-described write control scheme is appropriate for a memory array 50 to be configured as a 2N-bit deep device. Such an array will typically have an upper byte control signal $\overline{UB}$ provided. However, as discussed above, if N-bit deep architectures are to be implemented from the same layout, chip designers would ordinary include extra decoding logic. Such extra decoding logic is not required by making use of logic circuit 70.

Because logic circuit 70 is already provided on-chip to produce write control signal WRT_UB, it can also be utilized to produce write control signal WRT_(Add+=1). This is a write control signal for memory array 50 when configured as an N-bit deep architecture.

Recall that when used as an N-bit deep architecture, memory array 50 will be provided with an extra address bit, "Add+". The extra address bit is typically used for further decoding with additional decoding circuitry. However, logic circuit 70 eliminates the need for the additional circuitry. By employing Add+ as if it were an upper byte control signal, logic circuit 70 allows the use of the same logic to generate write control signal WRT_(Add+=1). The notation Add+=1 indicate that the write control signal will be activated when the extra address bit Add+ is a logic "1".

To illustrate, when the extra address bit Add+ is a logic "1", a complementary signal $\overline{Add+}$ may be generated (e.g., using an inverter). $\overline{Add+}$ is applied to NOR gate 72 in place of upper byte control signal $\overline{UB}$. Thus when $\overline{Add+}$ transitions to a logic LOW, write control signal WRT_(Add+=1) will be generated in the same fashion (and after the same delays) as write control signal WRT_UB as described above.

Thus, by selecting which of upper byte control signal $\overline{UB}$ or signal $\overline{Add+}$ is applied to NOR gate 72, the memory array 50 may be utilized as a 2N-bit deep or an N-bit deep architecture. The selection of which of these signals will be applied to NOR gate 72 may be made during fabrication of the memory device, for example, using a metal option and fabrication techniques well known to those or ordinary skill in the relevant arts. Alternatively, the selection could be made after fabrication of the device using, for example, programmable fuse elements or other programmable links which would allow electrical coupling to NOR gate 72. In either case, memory device manufacturers need only include a single logic circuit such as logic circuit 70 to provide write control signals WRT_UB or WRT_(Add+=1). No additional decoding circuitry (which would go unused on the 2N-bit deep part) need be provided. Of course, other logic gates which perform similar functions as NOR gate 72, NAND gate 74 and inverter 76 could be used.

FIG. 5B illustrates logic circuit 80 which generates write control signal WRT_LB from a lower byte control signal $\overline{LB}$ in the same fashion as logic circuit 70 for write control signal WRT_UB. Logic circuit 80 includes NOR gate 82, NAND gate 84, inverter 86 and delay element 88, each of which provide similar functions as their counterpart elements in logic circuit 70. Lower byte control signal $\overline{LB}$ is applied to one input of NOR gate 82 to eventually produce write control signal WRT_LB.

Logic circuit 80 may also be used to produce write control signal WRT$_{(Add+=0)}$, where the notation Add+=0 refers to an active signal when the extra address bit Add+ which is present for an N-bit deep architecture is active LOW. By applying Add+ to NOR gate 82 in place of lower byte control signal $\overline{LB}$, write control signal WRT_(Add+=0) may be generated for an N-bit deep implementation of memory array 50. Such a selection of which signal, $\overline{LB}$ or Add+, will be applied to NOR gate 82 may be made during fabrication (e.g., using a metal option) or after fabrication (e.g., using a programmable element).

Figure 6:
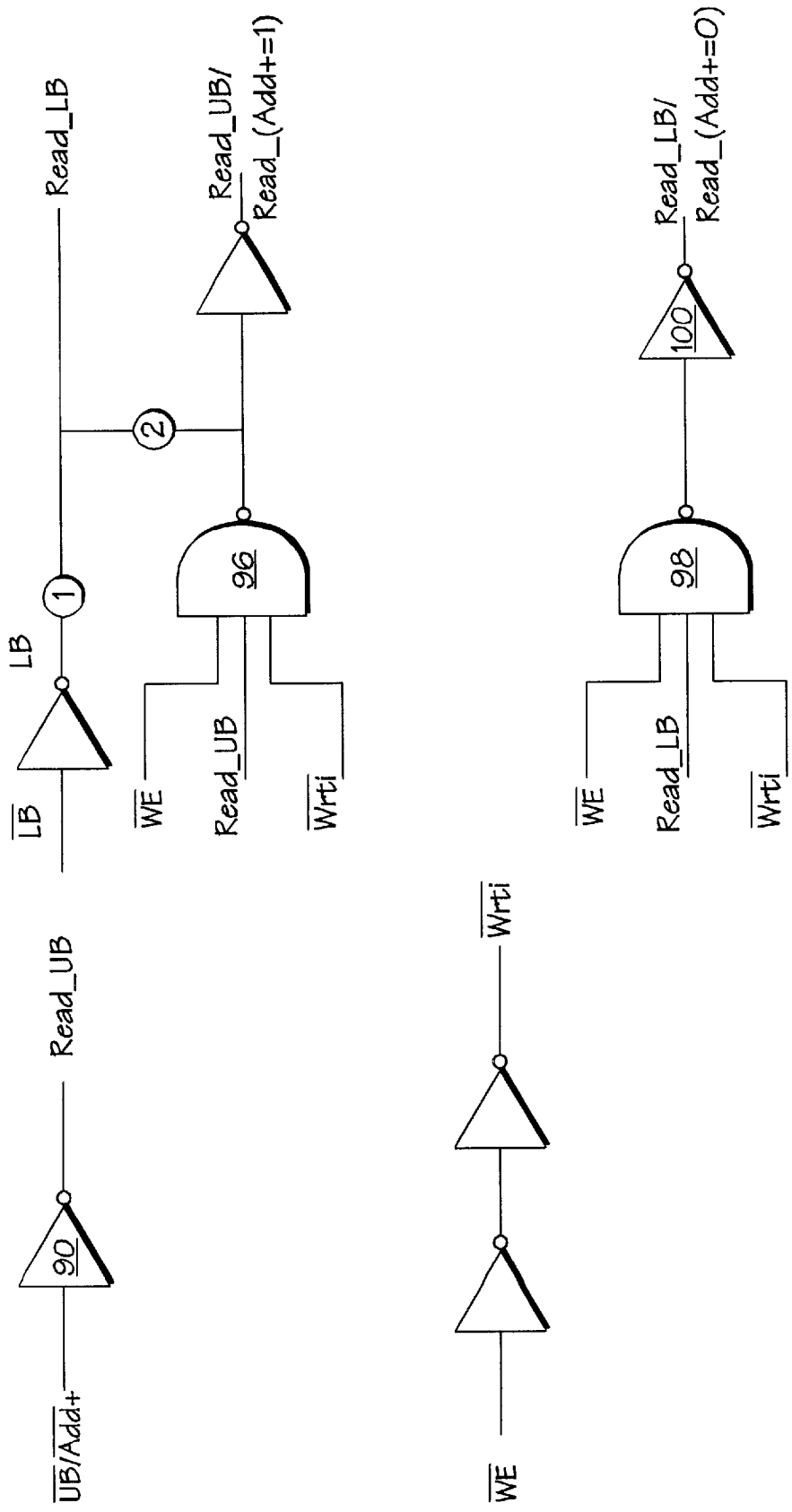
FIG. 6 illustrates additional exemplary read control circuitry for selecting the depth of a memory as either a 2N-bit-deep architecture or an N-bit-deep architecture.

FIG. 6 shows corresponding read path control circuitry for memory array 50. Again, $\overline{UB}$ refers to the complement of a upper byte control signal (active LOW), $\overline{WE}$ refers to a write enable signal, $\overline{LB}$ refers to a lower byte control signal (active LOW), Add+ and $\overline{Add+}$ are complementary signals produced by the extra address bit for an N-bit deep implementation. The circled numbers ① and ② refer to particular metal options ("metop"), where metal option 1 selects ① and a 2N-bit deep architecture while metal option ② selects ( and an N-bit deep architecture.

Notice first that inverter 90 which is provided in the read path control circuitry operates to produce a read control signal Read_UB from either the upper byte control signal $\overline{UB}$ or $\overline{Add+}$. That is, Read_UB is the logic complement of $\overline{UB}$ (and/or $\overline{Add+}$). Signal Read_UB will be used as a control signal by memory array 50 to allow read access to cells of the array.

Ultimately, read control signals READ_UB and READ_LB (for a 2N-bit deep architecture) or Read_(Add+=1) and Read_(Add+=0) (for an N-bit deep architecture) are produced using NAND gates 96 and 98. For signals READ_UB (or READ_Add+=1), write enable signal $\overline{WE}$, the read control signal Read_UB and $\overline{Wrti}$ are applied to the input of NAND gate 96. $\overline{Wrti}$ is a buffered version of $\overline{WE}$ as shown in FIG. 6. For an upper byte read operation or an Add+=1 read operation, $\overline{WE}$ Read_UB and $\overline{Wrti}$ will be HIGH. Thus, the output of NAND gate 96 will be LOW and read control signal READ_UB (or READ_(Add+=1)) will be HIGH.

To generate read control signal READ_LB, signals $\overline{WE}$, $\overline{Wrti}$ and a read control signal Read_LB are applied to the input of NAND gate 98. Notice that if a 2N-bit deep architecture (corresponding to metop 1) is used, Read_LB is the lower byte signal LB. However, if a N-bit deep architecture (corresponding to metop 2) is used, Read_LB is the output of NAND gate 96. Ultimately NAND gate 98 and inverter 100 provide read control signal READ_LB (or READ_(Add+=0)). The two read control signals, when active, allow memory reads from the selected cells of memory array 50.

Figure 7A:
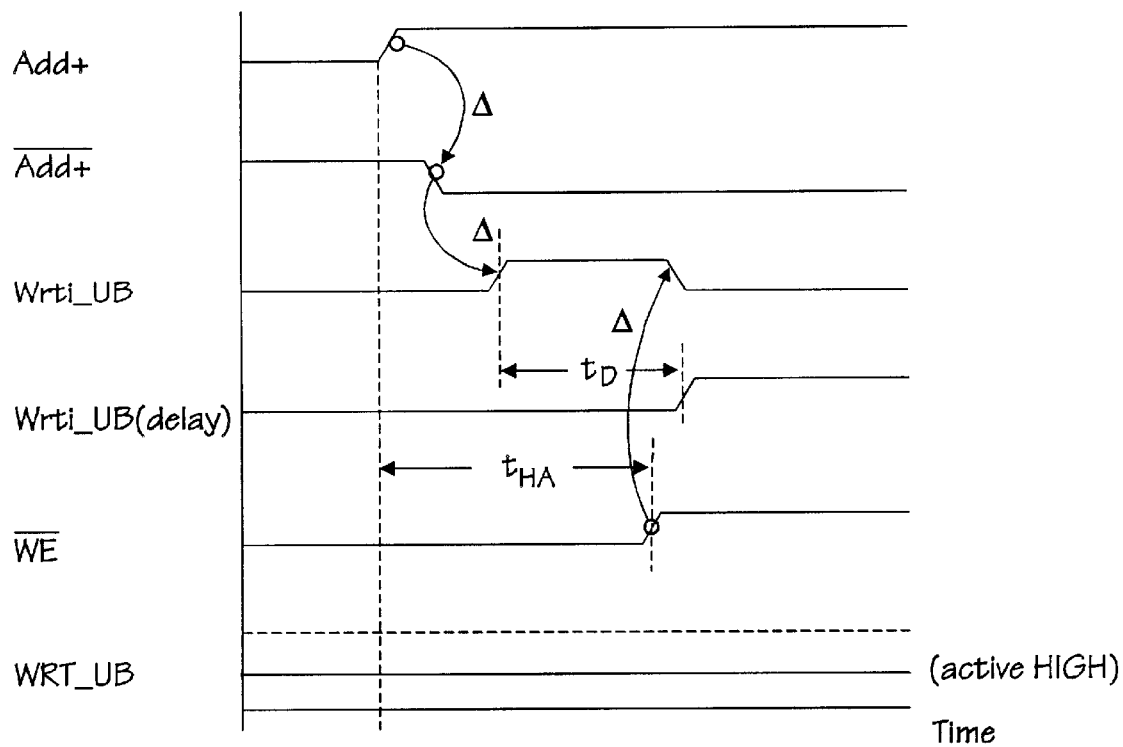
FIGS. 7a and 7b are timing diagrams illustrating address hold times and address set-up times for the circuitry illustrated in FIGS. 5a, 5b and 6.
Figure 7B:
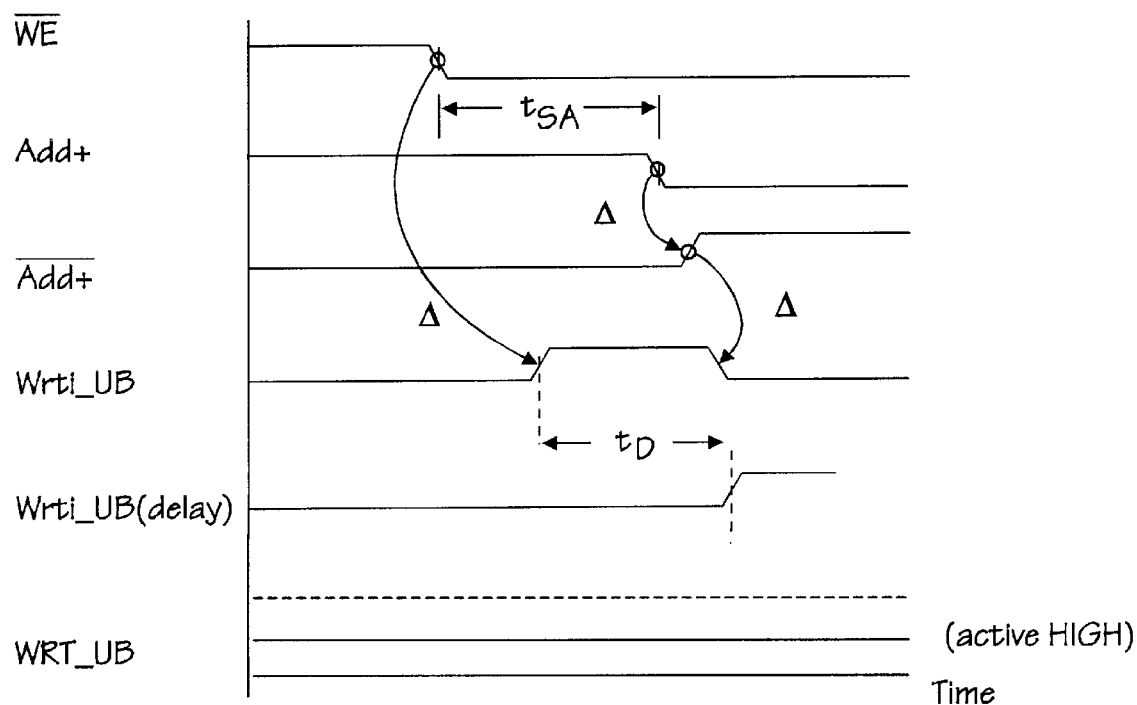

FIGS. 7a and 7b are timing diagrams illustrating address hold time ($t_{HA}$, FIG. 7A) and address set-up time ($t_{SA}$, FIG. 7B), where $\overline{Add+}$ refers to the complement of Add+ (the logic state of the extra address bit), "Wrti_UB" is the output of NOR gate 72 of FIG. 5A, and "Wrti_UB (delay)" is the delayed output of NOR gate 72 of FIG. 5A.

Notice in FIG. 7a that hold time $t_{HA}$ may be defined relative to a delay time $t_D$, the delay period associated with delay element 78. If the minimum address select delay is given by $t_D+\Delta$, where $\Delta$ is the delay time associated with logic required to produce $\overline{Add+}$ (the complement of Add+) and the maximum write deselect delay is $\Delta$, then $t_{HA}=\Delta-(t_D+\Delta)=-t_D$.

Also, as shown in FIG. 7b, setup time $t_{SA}$ may be determined by an address deselect delay and a write select delay. The minimum write select delay is $t_D+\Delta$ (the write control delay from delay element 78 plus the delay associated with logic to produce Wrti_UB). The address de-select delay is a maximum of $2\Delta$ as illustrated. Thus, $t_{SA}=2\Delta-(t_D+\Delta)=\Delta-t_D$.

Figure 8:
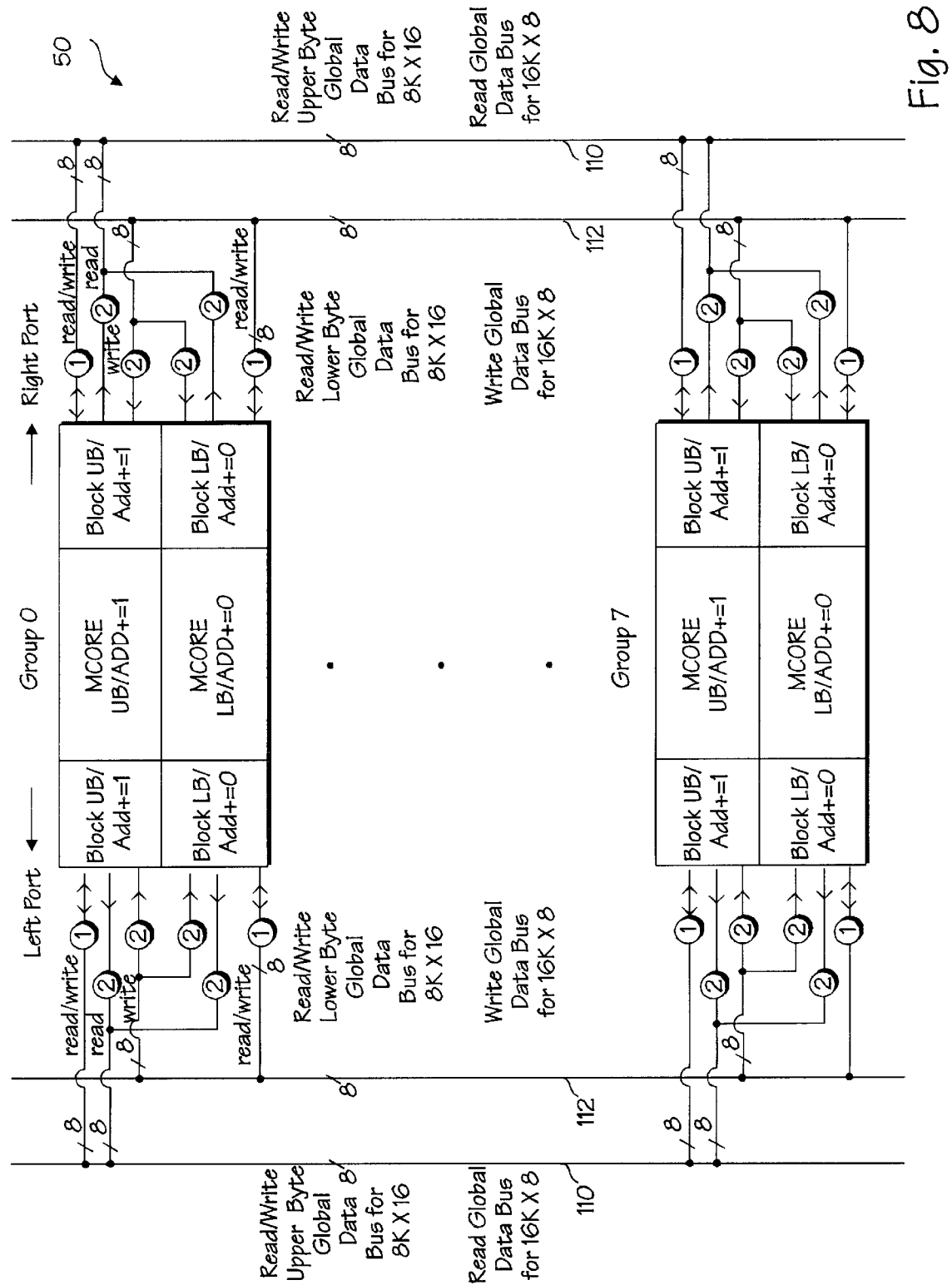
FIG. 8 shows one exemplary embodiment of data bus logic for realizing N-bit or 2N-bit architectures using metal options and showing bus directionality for those metal options in a memory array incorporating the present invention.

FIG. 8 shows one embodiment of control signal logic and bus directionality in memory array 50, where unidirectional arrow heads refer to unidirectional data flow, and bidirectional arrow head refer to bidirectional data flow. For metop 1, associated with a 2N-bit deep architecture, the read and write paths are bi-directional. That is, when metop 1 is selected, the Global data busses 110 and 112 for each port operate as read and write paths. Thus, the read and write control logic described above operates to control data flow from/to the MCORE elements of array 50 along each of these data paths. Notice in FIG. 8, each MCORE is divided into upper bytes (UB) and lower bytes (LB) when operated as a 2N-bit deep array. Alternatively, when operated as an N-bit deep array, each MCORE is segregated into N-bit portions through the use of the extra address bit Add+.

When metop 2 is selected (corresponding to the N-bit deep architecture) data bus 110 for each port functions as a read bus, transporting data from the array 50 MCORE elements. Data bus 112 for each port operates as a write bus, transporting data to each of the MCORE elements. The portion of the MCORE to be accessed is controlled by the Add+ signal and the appropriate read and write control signals described above.

Thus a circuit and method for controlling memory depth has been described. Although discussed with reference to certain exemplary embodiment, it will be appreciated that the present invention may find application in a wide number of memory and other semiconductor devices. For this reason, the invention should only be measured in terms of the claims which follow.

What is claimed is:

1. A circuit for controlling a memory depth, comprising:
   a memory array having (i) a fixed physical depth and (ii) a variable array depth selected from at least two members of the group consisting of xN bits, x(N+1) bits, 2x(N+1) bits, and (2x)N bits, where x and N are integers; and control logic configured to (a) control read and/or write operations in said memory array and (b) recognize a first one of said array depths in response to one or more read and/or write control signal(s) and a first address comprising m bits, and a second one of said array depths in response to said one or more read and/or write control signal(s) and a second address comprising (m+1) bits, wherein (m+1)<2N and m is an integer.

2. The circuit of claim 1, wherein said write control logic comprises upper byte and lower byte control circuitry.

3. The circuit of claim 1, wherein said depth of said memory is selected from the group consisting of xN bits and (2x)N bits, where x is an integer.

4. The circuit of claim 3, wherein said fixed physical depth is N bits.

5. The circuit of claim 1, wherein said write control logic further comprises a metal option configured to select the depth of said memory.

6. The circuit of claim 5, wherein said variable array depth of said memory is selected from the group consisting of xN bits and (2x)N bits, where x is an integer.

7. The circuit of claim 6, wherein said fixed physical depth is N bits.

8. The circuit of claim 5, wherein said variable array depth of said memory is selected from the group consisting of an N-bit depth and a 2N-bit depth.

9. The circuit of claim 8, wherein said fixed physical depth is N bits.

10. The circuit of claim 1, wherein said memory comprises two ports.

11. The circuit of claim 1, wherein said variable array depth is selected from the group consisting of xN bits and 2xN bits.

12. The circuit of claim 1, wherein said variable array depth is selected from the group consisting of x(N+1) bits and 2x(N+1) bits.

13. The circuit of claim 1, wherein said fixed physical depth is xN bits.

14. The circuit of claim 1, wherein said one or more read and/or write control signals comprise at least one member selected from the group consisting of a write enable signal, a chip enable signal, an arbitration logic signal, and complements thereof.

15. A circuit for controlling the depth of a memory, comprising:

a memory array having a physical depth of 2N bits, where N is an integer, said depth of said memory being selected from the group consisting of an N-bit depth and a 2N-bit depth; and control logic configured to (a) control read and/or write operations in said memory array, (b) select the depth of said memory and (c) recognize one of said depths in response to one or more read and/or write control signal(s) and a first address comprising m bits and the other of said depths in response to said one or more read and/or write control signal(s) and a second address comprising (m+1) bits, wherein (m+1)<2N and m is an integer.

16. The circuit of claim 15, wherein said control logic comprises upper byte and lower byte control circuitry.

17. The circuit of claim 15, wherein said control logic further comprises a metal option configured to select the depth of said memory.

18. The circuit of claim 15, wherein said memory array further comprises independent first and second ports.

19. The circuit of claim 15, wherein said one or more read and/or write control signals comprise at least one member selected from the group consisting of a write enable signal, a chip enable signal, an arbitration logic signal, and complements thereof.

* * * * *